United States Patent
Yin et al.

(10) Patent No.: US 12,262,596 B2
(45) Date of Patent: Mar. 25, 2025

(54) FLEXIBLE DISPLAY PANEL WITH PIXEL ISLANDS ARRANGED ON ELASTIC SUBSTRATE MANUFACTURING METHOD THEREOF, AND ELECTRONIC DEVICE

(71) Applicants: Wuhan China Star Optoelectronics Technology Co., Ltd., Hubei (CN); Wuhan China Star Optoelectronics Semiconductor Display Technology Co., Ltd., Hubei (CN)

(72) Inventors: Bingkun Yin, Hubei (CN); Li Hu, Hubei (CN); Liang Sun, Hubei (CN)

(73) Assignees: Wuhan China Star Optoelectronics Technology Co., Ltd., Wuhan (CN); Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 0 days.

(21) Appl. No.: 17/599,559

(22) PCT Filed: Jul. 19, 2021

(86) PCT No.: PCT/CN2021/107206
§ 371 (c)(1),
(2) Date: Sep. 29, 2021

(87) PCT Pub. No.: WO2023/272807
PCT Pub. Date: Jan. 5, 2023

(65) Prior Publication Data
US 2024/0049519 A1 Feb. 8, 2024

(30) Foreign Application Priority Data
Jun. 29, 2021 (CN) .......................... 202110729100.8

(51) Int. Cl.
H10K 59/124 (2023.01)
H10K 59/12 (2023.01)
H10K 102/00 (2023.01)

(52) U.S. Cl.
CPC ....... *H10K 59/124* (2023.02); *H10K 59/1201* (2023.02); *H10K 2102/311* (2023.02)

(58) Field of Classification Search
CPC ............. H10K 59/124; H10K 59/1201; H10K 2102/311
(Continued)

(56) References Cited

U.S. PATENT DOCUMENTS

2016/0293571 A1 10/2016 Yoon
2017/0110531 A1 4/2017 Ko
(Continued)

FOREIGN PATENT DOCUMENTS

CN 108649054 10/2018
CN 109509782 3/2019
(Continued)

*Primary Examiner* — Xia L Cross (57) ABSTRACT

The present application provides a flexible display panel, a manufacturing method of the flexible display panel, and an electronic device. The flexible display panel includes an elastic substrate, main pixel islands, and auxiliary pixel islands. When the elastic substrate is in a natural state, the main pixel islands enclose a light emitting side of the auxiliary pixel islands to receive the auxiliary pixel islands. When the elastic substrate is in a stretched state, the main pixel islands are away from the auxiliary pixel islands to expose the auxiliary pixel islands, and the auxiliary pixel islands cooperate with the main pixel islands for displaying images. Accordingly, the present application increases a pixel density of a stretched portion of the flexible display panel.

13 Claims, 4 Drawing Sheets

(58) Field of Classification Search
USPC .......................................................... 257/88
See application file for complete search history.

(56) References Cited

U.S. PATENT DOCUMENTS

2019/0043454 A1    2/2019   Choong
2019/0392786 A1   12/2019   Chida

FOREIGN PATENT DOCUMENTS

| CN | 109728064 |   | 5/2019  | | |
|----|-----------|---|---------|---|---|
| CN | 109728064 A | * | 5/2019 | ............. | H01L 27/32 |
| CN | 110036692 |   | 7/2019  | | |
| CN | 111883008 |   | 11/2020 | | |
| CN | 111951678 |   | 11/2020 | | |

* cited by examiner

FLEXIBLE DISPLAY PANEL WITH PIXEL ISLANDS ARRANGED ON ELASTIC SUBSTRATE MANUFACTURING METHOD THEREOF, AND ELECTRONIC DEVICE

RELATED APPLICATIONS

This application is a National Phase of PCT Patent Application No. PCT/CN2021/107206 having International filing date of Jul. 19, 2021, which claims the benefit of priority of Chinese Patent Application No. 202110729100.8 filed on Jun. 29, 2021. The contents of the above applications are all incorporated by reference as if fully set forth herein in their entirety.

FIELD AND BACKGROUND OF THE INVENTION

The present invention relates to a field of display technology and in particular, to a flexible display panel, a manufacturing method of the flexible display panel, and an electronic device.

With the development of the Internet of Things technology, more and more consumer electronics are indispensable in our daily lives. These consumer electronics usually need to realize not only two-dimensional plane of display, but also three-dimensional display. In order to meet more users' demands for display technology, stretchable display technology is created.

Conventional stretchable flexible display panels are usually provided with a plurality of pixel islands and a stretched portion connected between the pixel islands. Each pixel island comprises a pixel unit. When the flexible display panel is in a stretched state, the stretched portion is stretched and extends, and a spacing between the pixel islands is enlarged, so a pixel density of the stretched portion of the flexible display panel is reduced, resulting in lower display brightness of the flexible display panel, and poor quality of displayed images.

In summary, the conventional stretchable flexible display panels have a problem that the pixel density of the stretched portion is reduced. Therefore, there is a need to provide a flexible display panel, a manufacturing method of the flexible display panel, and an electronic device to overcome this problem.

SUMMARY OF THE INVENTION

The present application provides a flexible display panel, a manufacturing method of the flexible display panel, and an electronic device, which are used to solve a problem that a pixel density of a stretched portion of a conventional flexible display panel is reduced.

The present application provides a flexible display panel, comprising:
  an elastic substrate;
  a plurality of main pixel islands arranged on the elastic substrate, the main pixel islands comprising a plurality of main pixel units; and
  a plurality of auxiliary pixel islands arranged on the elastic substrate and disposed between the main pixel islands, the auxiliary pixel islands comprising a plurality of auxiliary pixel units;
  wherein when the elastic substrate is in a natural state, the main pixel islands adjacent to the auxiliary pixel islands are close to the auxiliary pixel islands, and the main pixel islands enclose a light emitting side of the auxiliary pixel islands to accommodate the auxiliary pixel islands; and when the elastic substrate is in a stretched state, the main pixel islands adjacent to the auxiliary pixel islands are away from the auxiliary pixel islands to expose the auxiliary pixel islands.

According to one embodiment of the present application, each of the main pixel islands comprises a first main body, at least one of the main pixel units is disposed on one side of each first main body away from the elastic substrate, each of the auxiliary pixel islands comprises a second main body, and at least one of the auxiliary pixel units is disposed on one side of each second main body away from the elastic substrate; and
  wherein a distance between one end of each first main body away from the elastic substrate and the elastic substrate is greater than a distance between one end of each second main body away from the elastic substrate and the elastic substrate; and when the elastic substrate is in the natural state, an orthographic projection of one end of each first main body away from the elastic substrate projected on the elastic substrate is partially overlapped with an orthographic projection of the adjacent second main body projected on the elastic substrate.

According to one embodiment of the present application, a size of one end of the first main body away from the elastic substrate is larger than a size of one end of the first main body close to the elastic substrate.

According to one embodiment of the present application, each of the first main bodies comprises a first rigid substrate and a support pillar, the support pillar is disposed on one side of the first rigid substrate away from the elastic substrate, and each of the second main bodies comprises a second rigid substrate; and
  a distance between one end of each support pillar away from the elastic substrate and the elastic substrate is greater than a distance between one end of each second rigid substrate away from the elastic substrate and the elastic substrate.

According to one embodiment of the present application, the first rigid substrates and the second rigid substrates are arranged in a same layer, and an area of an orthographic projection of each first rigid substrate projected on the elastic substrate is smaller than an area of an orthographic projection of each second rigid substrate projected on the elastic substrate.

According to one embodiment of the present application, a size of each support pillar gradually decreases in a direction from one end of the support pillar away from the elastic substrate to the elastic substrate.

According to one embodiment of the present application, a planar shape of one end of each support pillar away from the elastic substrate comprises a rectangle or a rhombus.

According to one embodiment of the present application, each first main body further comprises a first flexible array layer, each first flexible array layer is disposed on one side of the corresponding support pillar away from the elastic substrate, each second main body further comprises a second flexible array layer, and each second flexible array layer is disposed on one side of the corresponding second rigid substrate away from the elastic substrate; and
  wherein the flexible display panel further comprises a plurality of connecting portions, and the connecting portions connect the first flexible array layers and the second flexible array layers adjacent to each other; and when the elastic substrate is in the natural state, the connecting portions are accommodated in a plurality of accommodating spaces enclosed by the first main bodies.

The present application provides an electronic device, comprising a flexible display panel, wherein the flexible display panel comprises:
an elastic substrate;
a plurality of main pixel islands arranged on the elastic substrate, the main pixel islands comprising a plurality of main pixel units; and
a plurality of auxiliary pixel islands arranged on the elastic substrate and disposed between the main pixel islands, the auxiliary pixel islands comprising a plurality of auxiliary pixel units;
wherein when the elastic substrate is in a natural state, the main pixel islands adjacent to the auxiliary pixel islands are close to the auxiliary pixel islands, and the main pixel islands enclose a light emitting side of the auxiliary pixel islands to accommodate the auxiliary pixel islands; and when the elastic substrate is in a stretched state, the main pixel islands adjacent to the auxiliary pixel islands are away from the auxiliary pixel islands to expose the auxiliary pixel islands.

According to one embodiment of the present application, each of the main pixel islands comprises a first main body, at least one of the main pixel units is disposed on one side of each first main body away from the elastic substrate, each of the auxiliary pixel islands comprises a second main body, and at least one of the auxiliary pixel units is disposed on one side of the second main body away from the elastic substrate; and
wherein a distance between one end of each first main body away from the elastic substrate and the elastic substrate is greater than a distance between one end of each second main body away from the elastic substrate and the elastic substrate; and when the elastic substrate is in the natural state, an orthographic projection of one end of each first main body away from the elastic substrate projected on the elastic substrate is partially overlapped with an orthographic projection of the adjacent second main body projected on the elastic substrate.

According to one embodiment of the present application, a size of one end of the first main body away from the elastic substrate is larger than a size of one end of the first main body close to the elastic substrate.

According to one embodiment of the present application, each of the first main bodies comprises a first rigid substrate and a support pillar, the support pillar is disposed on one side of the first rigid substrate away from the elastic substrate, and each of the second main bodies comprises a second rigid substrate; and a distance between one end of each support pillar away from the elastic substrate and the elastic substrate is greater than a distance between one end of the second rigid substrate away from the elastic substrate and the elastic substrate.

According to one embodiment of the present application, the first rigid substrates and the second rigid substrates are arranged in a same layer, and an area of an orthographic projection of each first rigid substrate projected on the elastic substrate is smaller than an area of an orthographic projection of each second rigid substrate projected on the elastic substrate.

According to one embodiment of the present application, a size of each support pillar gradually decreases in a direction from one end of the support pillar away from the elastic substrate to the elastic substrate.

According to one embodiment of the present application, a planar shape of one end of each support pillar away from the elastic substrate comprises a rectangle or a rhombus.

According to one embodiment of the present application, each first main body further comprises a first flexible array layer, each first flexible array layer is disposed on one side of the corresponding support pillar away from the elastic substrate, each second main body further comprises a second flexible array layer, and each second flexible array layer is disposed on one side of the corresponding second rigid substrate away from the elastic substrate; and
wherein the flexible display panel further comprises a plurality of connecting portions, and the connecting portions connect the first flexible array layers and the second flexible array layers adjacent to each other; and when the elastic substrate is in the natural state, the connecting portions are accommodated in a plurality of accommodating spaces enclosed by the first main bodies.

The present application provides a manufacturing method of a flexible display panel, comprising:
forming an array layer on a flexible substrate;
forming a plurality of main pixel units and a plurality of auxiliary pixel units on the array layer;
setting an elastic substrate in a pre-stretched state, and forming a plurality of first rigid substrates and a plurality of second rigid substrates on the elastic substrate;
forming a support pillar on each of first rigid substrates;
attaching the flexible substrate to the elastic substrate, wherein the main pixel units are aligned with the support pillars, and the auxiliary pixel units are aligned with the second rigid substrates; and
restoring the elastic substrate to a natural state.

Advantages of the Present Application:

The advantages of the present disclosure: The present application provides a flexible display panel, a manufacturing method of the flexible display panel, and an electronic device. The electronic device comprises the flexible display panel. The flexible display panel comprises an elastic substrate, and a plurality of main pixel islands and a plurality of auxiliary pixel islands disposed on the elastic substrate. The auxiliary pixel islands are disposed between the main pixel islands. The main pixel islands comprise a plurality of main pixel units, and the auxiliary pixel islands comprise a plurality of auxiliary pixel units. When the flexible substrate is in a natural state, the main pixel islands adjacent to the auxiliary pixel islands are close to the auxiliary pixel islands, and the main pixel islands enclose a light emitting side of the auxiliary pixel islands to accommodate the auxiliary pixel islands. Accordingly, the auxiliary pixel islands are arranged without enlarging a spacing between the adjacent main pixel islands, so that the present application maintains a pixel density of the flexible display panel in a natural state. When the elastic substrate is in a stretched state, the main pixel islands adjacent to the auxiliary pixel islands are away from the auxiliary pixel islands to expose the auxiliary pixel islands. The exposed auxiliary pixel islands cooperate with the main pixel islands for displaying images, thereby increasing a pixel density of a stretched portion of the flexible display panel, and improving display performance of the stretched portion of the flexible display panel.

BRIEF DESCRIPTION OF THE SEVERAL VIEWS OF THE DRAWINGS

In order to more clearly illustrate the embodiments of the present disclosure or related art, figures which will be described in the embodiments are briefly introduced hereinafter. It is obvious that the drawings are merely for the purposes of illustrating some embodiments of the present disclosure, and a person having ordinary skill in this field can obtain other figures according to these figures without inventive work.

DESCRIPTION OF SPECIFIC EMBODIMENTS OF THE INVENTION

A description is provided below to illustrate the embodiments of the present disclosure with reference to the accompanying drawings. The directional terms in the present application, such as "up", "down", "front", "rear", "left", "right", "inner", "outer", and "lateral", are for illustrative purposes based on the accompanying drawings. Therefore, the directional terms are used for ease of explaining and understanding the present disclosure, rather than limiting the present disclosure. In the drawings, structurally similar elements are denoted by the same reference numerals.

The present disclosure is further described below in conjunction with the accompanying drawings and specific embodiments:

The present application provides a flexible display panel, a manufacturing method of the flexible display panel, and an electronic device. The flexible display panel 100 is a stretchable display panel. The manufacturing method of the flexible display panel is used for manufacturing the flexible display panel 100. The electronic device comprises the flexible display panel 100.

The electronic device can further comprise a housing. The flexible display panel can be installed in the housing, and an accommodating chamber is defined in the housing. The accommodating chamber can be used to receive a motherboard, a printed circuit board, a battery, and other electronic components for driving the flexible display panel. A stretching mechanism for stretching the flexible display panel can be placed in the accommodating chamber. The stretching mechanism can be used to drive stretching or shrinking of the flexible display panel, so that the flexible display panel 100 can be stretched to a stretched state or restored to a natural state.

In the present application, the electronic device can be an in-vehicle display terminal, such as an in-vehicle display and a driving recorder. The electronic device can also be a mobile terminal, such as a smart phone, a tablet computer, and a notebook computer, or alternatively, a wearable terminal like a smart watch, a smart bracelet, smart glasses, and an augmented reality device. The electronic device can also be a fixed terminal, such as a desktop computer and a TV, or alternatively, a vehicle-mounted display terminal like an in-vehicle display or a driving recorder.

Figure 1:
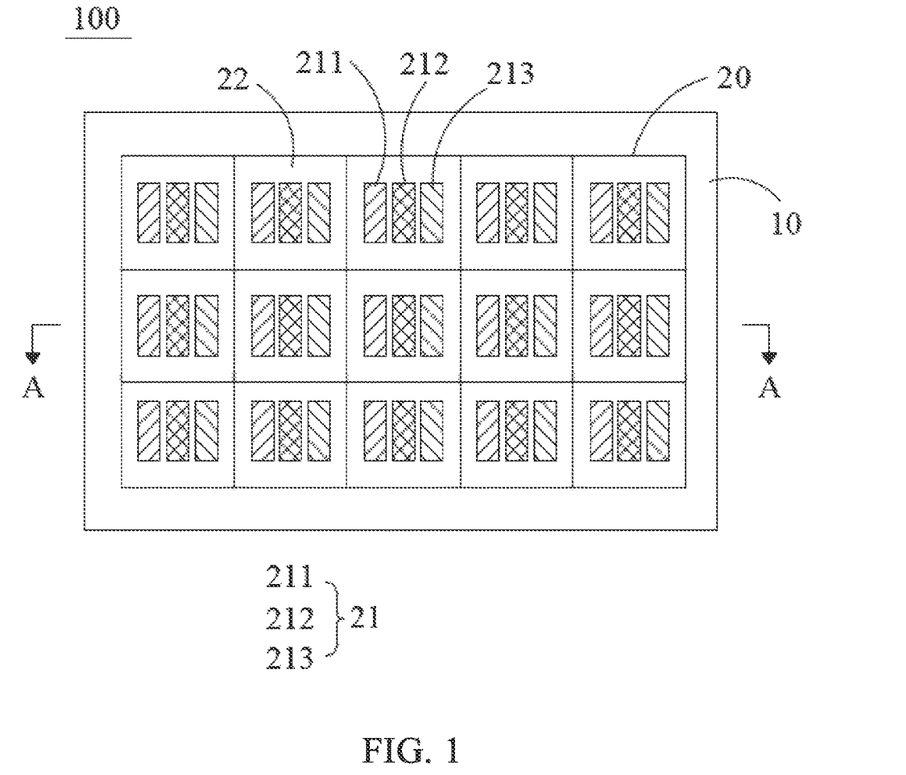
FIG. 1 is a schematic planar structural view of a flexible display panel in a natural state according to one embodiment of the present application.
Figure 2:
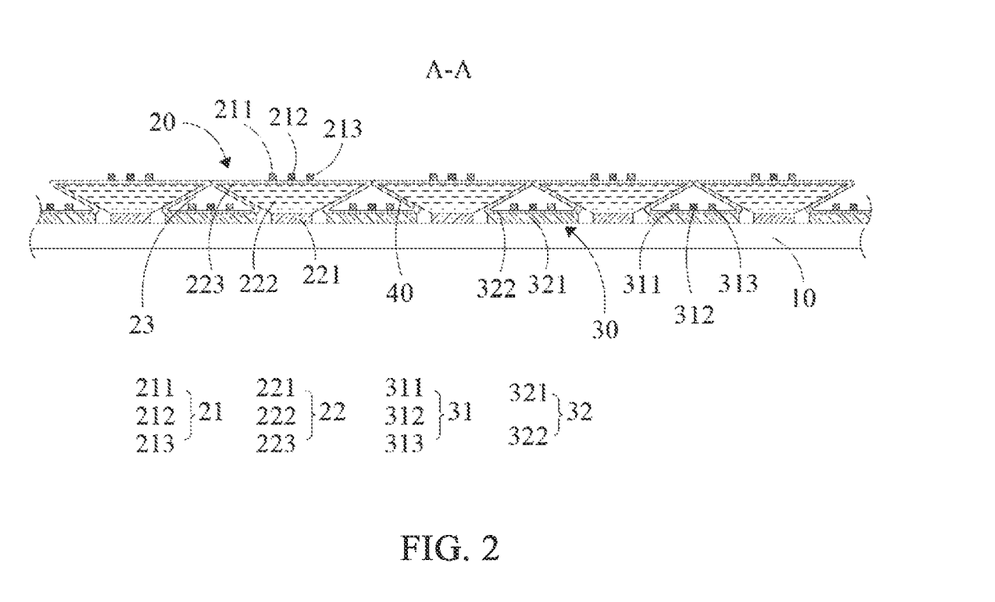
FIG. 2 is a schematic cross-sectional view, taken along an A-A direction, illustrating the flexible display panel in the natural state according to one embodiment of the present application.

Please refer to FIG. 1 to FIG. 2. FIG. 1 is a schematic planar structural view of the flexible display panel in a natural state according to one embodiment of the present application. FIG. 2 is a cross-sectional view, taken along an A-A direction, illustrating the flexible display panel in the natural state according to one embodiment of the present application. The flexible display panel comprises an elastic substrate 10, a plurality of main pixel islands 20, and a plurality of auxiliary pixel islands 30. The main pixel islands 20 and the auxiliary pixel islands 30 are all arranged on the elastic substrate 10 and located on a same side of the elastic substrate 10. The auxiliary pixel islands 30 are disposed between the adjacent main pixel islands 20.

The display panel 100 comprises a display area A and a peripheral area B located at a periphery of the display area A; a substrate 200 and an encapsulation component 300 arranged on the substrate 200 in the peripheral area B. The encapsulation component 300 comprises a plurality of barrier units 310 spaced apart from each other, an encapsulation member, and an opening 330 defined between each two adjacent ones of the barrier units 310. The encapsulation member comprises a first array encapsulation unit 341 arranged on each barrier unit 310 and a second array encapsulation unit 342 located between each two adjacent barrier units 310 and arranged in the opening 330. The first array encapsulation unit 341 and the second array encapsulation unit 342 are separate from each other. In each barrier unit, an area of an end surface of the barrier unit 310 close to the substrate 200 is smaller than an area of an end surface of the barrier unit 310 away from the substrate 200. Please refer to FIG. 1 for details.

It should be noted that FIGS. 1 and 2 only illustrate a structure and positional relationship of some of the main pixel islands 20 and the auxiliary pixel islands 30 in the flexible display panel 100. Other main pixel islands 20 and other auxiliary pixel islands 30 have same structure and positional relationship as those illustrated in FIGS. 1 and 2. A number of the main pixel islands 20 and the auxiliary pixel islands 30 in FIGS. 1 and 2 does not represent a number of the main pixel islands 20 and the auxiliary pixel islands 30 in the flexible display panel in practice.

Each main pixel island 20 comprises at least one main pixel unit 21, and each main pixel unit 21 comprises at least one main sub-pixel. Each auxiliary pixel island 30 comprises at least one auxiliary pixel unit 31, and each auxiliary pixel unit 31 comprises at least one auxiliary sub-pixel.

In the present application, each main pixel island 20 comprises one main pixel unit 21, and each main pixel unit 21 comprises three main sub-pixels, namely a red main sub-pixel 211, a green main sub-pixel 212, and a blue main sub-pixel 213. The red main sub-pixel 211, the green main sub-pixel 212, and the blue main sub-pixel 213 can be arranged on the main pixel island 20 according to a predetermined rule.

In practice, a number of the main pixel units 21 included in each main pixel island 20 is not limited to one as disclosed above, and can also be two or three or more. A number of the main sub-pixels included in each main pixel unit 21 is not limited to three as disclosed above, and can also be one, two, or more than three. A color of each main sub-pixel is not limited to red, blue, or green, and can also be white or other color.

In the present application, each auxiliary pixel island 30 comprises one auxiliary pixel unit 31, and each auxiliary pixel unit 31 comprises three auxiliary sub-pixels, which are a red auxiliary sub-pixel 311, a green auxiliary sub-pixel 312, and a blue auxiliary sub-pixel 313. The red auxiliary sub-pixel 311, the green auxiliary sub-pixel 312, and the blue auxiliary sub-pixel 313 can be arranged on the auxiliary pixel island 30 according to a predetermined rule.

In practice, a number of the auxiliary pixel units 31 of each auxiliary pixel island 30 is not limited to one as disclosed above, and can also be two or three. A number of the auxiliary sub-pixels included in each sub-pixel unit 31 is not limited to three as disclosed above, and can also be one, two, or more than three. A color of each auxiliary sub-pixel is not limited to red, green, or blue as mentioned above, and can also be white or other color.

In the present application, each of the red main sub-pixels 211, the green main sub-pixels 212, the blue main sub-pixels 213, the red auxiliary sub-pixels 311, the green auxiliary sub-pixels 312, and the blue auxiliary sub-pixels 313 corresponds to a light-emitting device with a matching color. The light-emitting device can be an organic light-emitting diode, a mini light-emitting diode, or a micro light-emitting diode.

In the present application, the elastic substrate 10 comprises polydimethylsiloxane (PDMS). PDMS has good elasticity, so the elastic substrate 10 can be restored to its original shape after being stretched.

Figure 3:
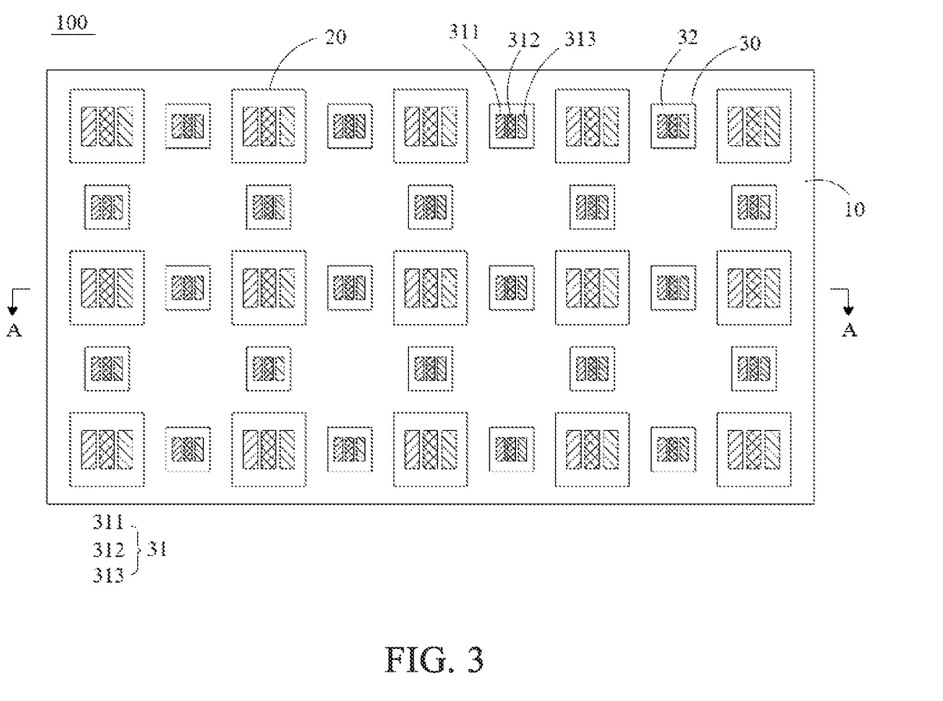
FIG. 3 is a schematic planar structural view of the flexible display panel in a stretched state according to one embodiment of the present application.
Figure 4:
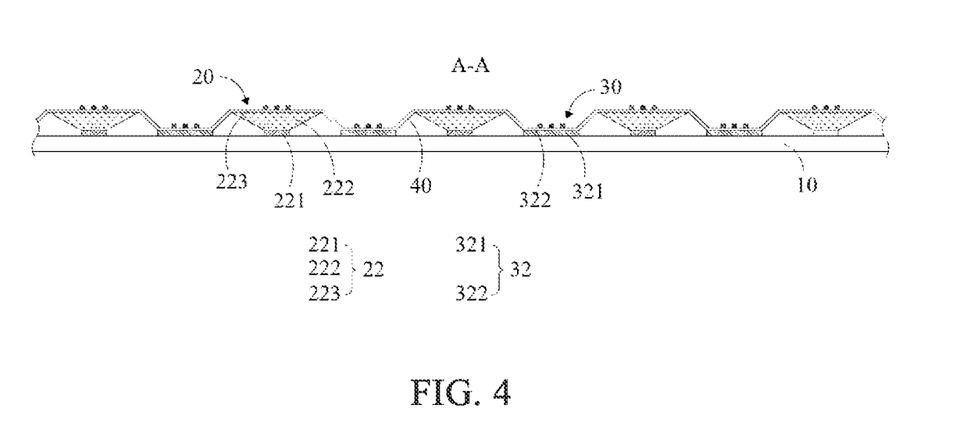
FIG. 4 is a schematic cross-sectional view, taken along the A-A direction, illustrating the flexible display panel in the stretched state according to one embodiment of the present application.

Please refer to FIGS. 1 to 4. FIG. 3 is a schematic planar structural view illustrating the flexible display panel in a stretched state according to one embodiment of the present application. FIG. 4 is a schematic cross-sectional view, taken along the A-A direction, illustrating the flexible display panel in the stretched state according to one embodiment of the present application.

The elastic substrate 10 has the natural state and the stretched state. When the elastic substrate 10 is in the natural state, the flexible display panel 100 is also in the natural state. The main pixel islands 20 disposed on the flexible substrate 10 and located adjacent to the auxiliary pixel islands 30 are close to the auxiliary pixel islands 30 and enclose a light emitting side of the auxiliary pixel islands 30 to accommodate the auxiliary pixel islands 30. By using the main pixel islands 20 adjacent to the auxiliary pixel islands 30 to enclose and accommodate the auxiliary pixel islands 30, the present application prevents a spacing between the main pixel islands 20 from being enlarged due to the auxiliary pixel islands 30 added between the main pixel islands 20, thus ensuring a pixel density of the flexible display panel 100 in the natural state.

When the elastic substrate 10 is in the stretched state, the flexible display panel 100 is also in the stretched state. The main pixel islands 20 adjacent to the auxiliary pixel islands 30 are away from the auxiliary pixel islands 30 to expose the auxiliary pixel islands 30. The exposed auxiliary pixel islands 30 can emit light under the control of a driving circuit, and cooperate with the main pixel islands 20 to display images, so as to fill in an area between the adjacent main pixel islands 20 which is non-luminous due to the stretching of the elastic substrate 10. As a result, a pixel density of a stretched portion of the flexible display panel 100 is increased, so that an image display quality of the stretched portion of the flexible display panel 100 is improved.

Furthermore, each main pixel island 20 comprises a first main body 22, the main pixel unit 21 is disposed on one side of the first main body 22 away from the elastic substrate 10, each auxiliary pixel island 30 comprises a second main body 32, and the auxiliary pixel unit 31 is disposed on one side of the second main body 32 away from the elastic substrate 10.

As shown in FIG. 2, the first main body 22 is a carrier that carries and drives the main pixel unit 21 to emit light, and the second main body 32 is a carrier that carries and drives the auxiliary pixel unit 31 to emit light. A distance between one end of the first main body 22 away from the elastic substrate 10 to the elastic substrate 10 is greater than a distance between one end of the second main body 32 away from the elastic substrate 10 to the elastic substrate 10. When the elastic substrate 10 is in the natural state, an orthographic projection of one end of the first main body 22 away from the elastic substrate 10 projected on the elastic substrate 10 partially overlaps an orthographic projection of the adjacent second main body 32 projected on the elastic substrate 10. This way, when the elastic substrate 10 is in the natural state, one first main body 22 can shield a portion of the corresponding auxiliary pixel island 30 on the light emitting side of the auxiliary pixel island 30, and two or more first main bodies 22 can hide an adjacent one of the auxiliary pixel islands 30 between the multiple main pixel islands 20.

Furthermore, as shown in FIG. 2, a size of one end of the first main body 22 away from the elastic substrate 10 is larger than a size of one end of the first main body 22 close to the elastic substrate 10. This way, one ends of the first main bodies 22 away from the elastic substrate 10, and side walls connecting two ends of the first main bodies 22 can enclose and define a plurality of accommodating spaces 23. The auxiliary pixel islands 30 can be accommodated in the accommodating spaces 23, the light emitting side of the auxiliary pixel islands 30 is shielded by one end of each first main body 22 away from the elastic substrate 10. Since the main pixel unit 21 is disposed on one end of the first main body 22 away from the elastic substrate 10, a spacing between the main pixel units 21 on adjacent main pixel islands 20 is not affected by the auxiliary pixel islands 30, thereby ensuring a resolution of the flexible display panel 100 in the natural state.

In the present application, a cross-section of the first main body 22 along the A-A direction is an inverted trapezoid, and a planar shape of one end of the first main body 22 away from the elastic substrate 10 is a rectangle. The main pixel islands 20 can be disposed corresponding to the auxiliary pixel islands 30. For example, as shown in FIGS. 1 and 3, the main pixel islands 20 can be arranged on the upper and lower or left and right sides of the auxiliary pixel islands 30. When the elastic substrate 10 is in the natural state, the main pixel islands 20 located on the upper and lower or left and right sides of the auxiliary pixel islands 30 20 are close to the auxiliary pixel islands 30, and straight sides of the first main bodies 22 of the two main pixel islands 20 are close and attached to each other, so as to hide the auxiliary pixel island 30 in the accommodating space enclosed by the two main pixel islands 20.

In practice, the planar shape of one end of the first main body 22 away from the elastic substrate 10 is not limited to the rectangle as mentioned above, and can also be other polygon such as a rhombus and a pentagon.

In one embodiment, the first main body 22 and the second main body 32 are both an integrally formed structure. Both the first main body 22 and the second main body 32 can be made of at least one of silicon nitride or silicon oxide. This way, both the first main body 22 and the second main body 32 can have good rigidity and resistance to deformation, so as to prevent the signal lines, thin film transistor devices and light emitting devices in the main pixel island 20 and the auxiliary pixel island 30 from being deformed or even damaged during a stretching process, thereby ensuring stability of the flexible display panel 100.

In one embodiment, as shown in FIG. 2, each of the first main bodies 22 comprises a first rigid substrate 221 and a support pillar 222. The support pillar 222 is disposed on one side of the first rigid substrate 221 away from the elastic substrate 10. The main pixel unit 21 is disposed on one side of the support pillar 222 away from the elastic substrate 10. Each of the second main bodies 32 comprises a second rigid substrate 321, and the auxiliary pixel unit 31 is disposed on one side of the second rigid substrate 321 away from the elastic substrate 10.

The first rigid substrate 221 and the second rigid substrate 321 are used to provide rigidity to one end of the first main body 22 and one end of the second main body 32 close to the elastic substrate 10, so as to prevent the main pixel island 20 and the auxiliary pixel island 30 from being deformed by stretching. Both the first rigid substrate 221 and the second rigid substrate 321 can be made of at least one of silicon nitride or silicon oxide.

A distance between one end of the support pillar 222 away from the elastic substrate 10 and the elastic substrate 10 is greater than a distance between one end of the second rigid substrate 321 away from the elastic substrate 10 and the elastic substrate 10. The support pillar 222 is used to increase a height of the main pixel island 20 in a thickness direction of the flexible display panel 100. The support pillar 222 can be made of a light-shielding material, and thereby the main pixel island 20 can better shield the auxiliary pixel island 30 to avoid light leakage when the elastic substrate 10 in the natural state accommodates the auxiliary pixel islands 30 between the main pixel islands 20.

The first rigid substrate 221 and the second rigid substrate 321 are arranged in a same layer. As shown in FIG. 2, both the first rigid substrate 221 and the second rigid substrate 321 can be disposed on the elastic substrate 10. The first rigid substrate 221 and the second rigid substrate 321 have a same thickness in the thickness direction of the flexible display panel 100. In actual manufacturing, the first rigid substrate 221 and the second rigid substrate 321 can be manufactured using a same material through a same process, which can reduce manufacturing processing steps of the flexible display panel 100 and reduce production costs.

Furthermore, an area of an orthographic projection of each first rigid substrate 221 projected on the elastic substrate 10 is smaller than an area of an orthographic projection of each second rigid substrate 321 projected on the elastic substrate 10. By reducing a size of the first rigid substrate 221, a distance between the adjacent main pixel islands 20 can be reduced, and the accommodating space 23 enclosed by the adjacent first main bodies 22 can be larger, thereby ensuring the pixel density of the flexible display panel 100 in the natural state, and also avoiding interference between the main pixel islands 20 and the auxiliary pixel islands 30.

Further, in a direction from one end of the support pillar 222 away from the elastic substrate 10 to the elastic substrate 10, a size of the support pillar 222 gradually decreases. As shown in FIG. 1 and FIG. 2, in the present application, the cross section of the support pillar 222 in the A-A direction is an inverted trapezoid. A planar shape of one end of the support pillar 222 and the planar shape of one end of the first main body 22 away from the elastic substrate 10 are both rectangular. This way, the support pillars 222 of the adjacent main pixel islands 20 can be used to enclose the accommodating spaces 23 to hide the auxiliary pixel islands 30 between the main pixel islands 20. In practice, one end of the support pillar 222 away from the elastic substrate 10 is not limited to the rectangular shape mentioned above, and can also be a rhombus, a pentagon, or other polygon.

Furthermore, each first main body 22 further comprises a first flexible array layer 223, and each first flexible array layer 223 is disposed on one side of the corresponding support pillar 222 away from the elastic substrate 10. Each second main body 32 further comprises a second flexible array layer 322, and each second flexible array layer 322 is disposed on one side of the corresponding second rigid substrate 321 away from the elastic substrate 10.

Specifically, the first flexible array layer 223 can comprise a first flexible substrate and a first array layer. The first array layer comprises a pixel driving circuit. The pixel driving circuit can comprise a signal line, a capacitor, and at least one thin film transistor. A light-emitting device of each main sub-pixel in the main pixel unit 21 is connected to the pixel driving circuit, and is driven by the pixel driving circuit to emit light. The second flexible array layer 322 can comprise a second flexible substrate and a second array layer. The second array layer also has a pixel driving circuit. The pixel driving circuit can comprise a signal line, a capacitor, and at least one thin film transistor. A light-emitting device of each main sub-pixel in the auxiliary pixel unit 31 is connected to the pixel driving circuit and is driven by the pixel driving circuit to emit light.

Further, the flexible display panel 100 further comprises a plurality of connecting portions 40 for connecting the adjacent first flexible array layer 223 and the second flexible array layer 322. The connecting portions 40 can comprise a third flexible substrate and a wiring layer disposed on the third flexible substrate, and the wiring layer can comprise metal signal lines arranged in multiple layers.

In the present application, the first flexible substrate, the second flexible substrate, and the third flexible substrate can be different parts of a whole flexible substrate. The first array layer, the second array layer, and the wiring layer can be different parts of a same thin film transistor array layer.

As shown in FIG. 2, when the elastic substrate 10 is in the natural state, the connecting portions 40 are accommodated in the accommodating spaces 23 enclosed by the first main bodies 22 of the main pixel islands 20, thereby preventing the connecting portions 40 from blocking the main pixel units 21 on the main pixel islands 20, and also preventing the connecting portions 40 from being squeezed by the adjacent main pixel islands 20.

When the flexible display panel 100 is stretched from the natural state, the connecting portions 40 are gradually exposed from the accommodating spaces 23 and are stretched and straightened. The elastic substrate 10 in the flexible display panel 100 has good elasticity and provides elasticity for restoring deformation. The connecting portions 40 stop being stretched after the connecting portions 40 are straightened by gradually stretching, so as to ensure that metal lines in the connecting portions 40 do not break by stretching.

In one embodiment, via holes can be defined in gaps between the main pixel islands 20, the auxiliary pixel islands 30, and the connecting portions 40. The via holes are filled with a flexible material, so as to improve a stretching ability of the flexible display panel 100. In practice, there can be no via holes defined in the gaps between the main pixel islands 20, the auxiliary pixel islands 30, and the connecting portions 40, and instead, the whole flexible array substrate is attached to the support pillars 222 or the second rigid substrates 321. The connecting portions 40 and film layers between the main pixel islands 20, the auxiliary pixel islands 30, and the connecting portions 40 can all be accommodated in the accommodating spaces 23.

Figure 5:
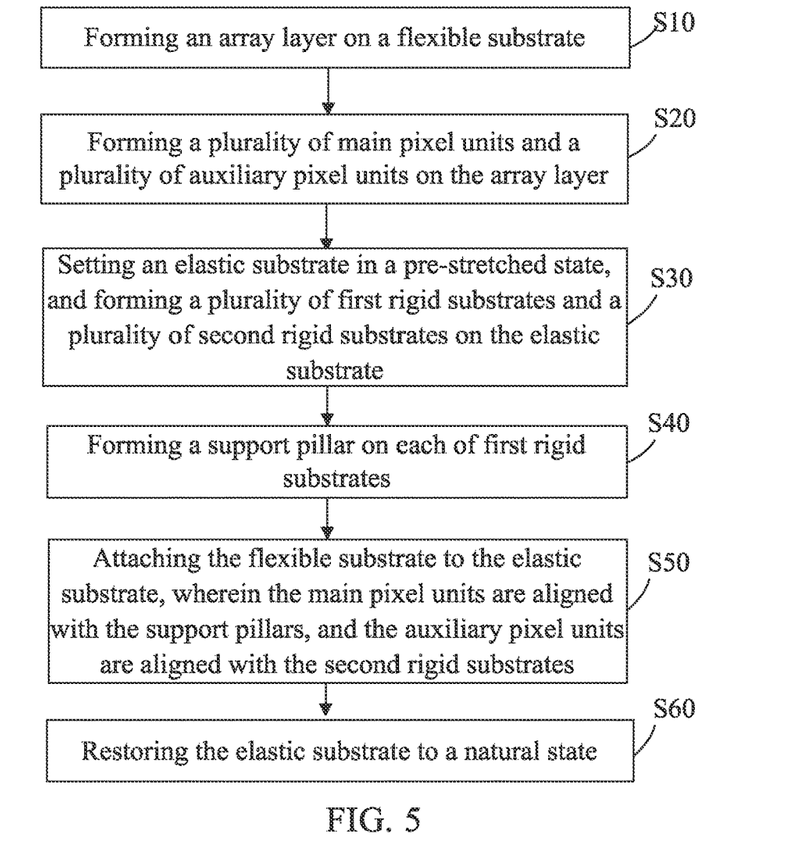
FIG. 5 is a process flow diagram illustrating a manufacturing method of the flexible display panel according to one embodiment of the present application.
Figure 6A:
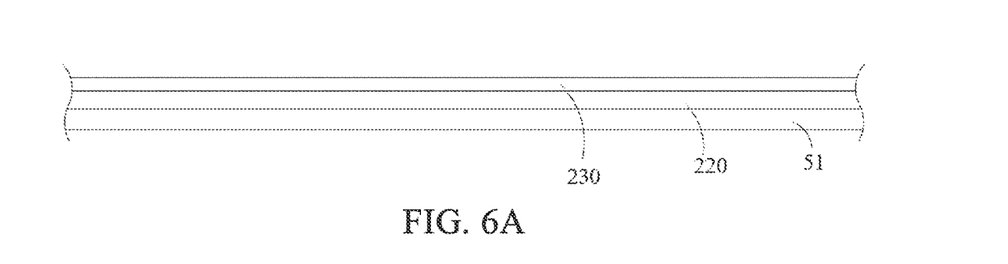
FIGS. 6A, 6B, 6C, 6D and 6E are schematic views illustrating steps in the manufacturing method of the flexible display panel according to one embodiment of the present application.
Figure 6B:
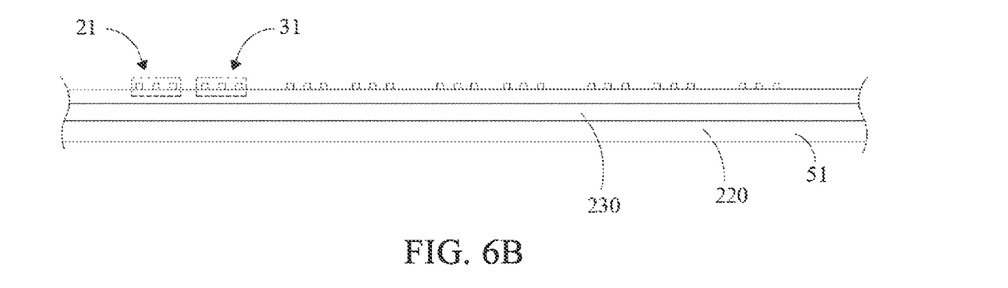
Figure 6C:
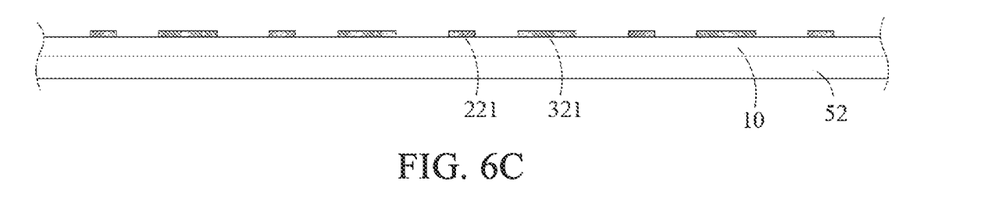
Figure 6D:
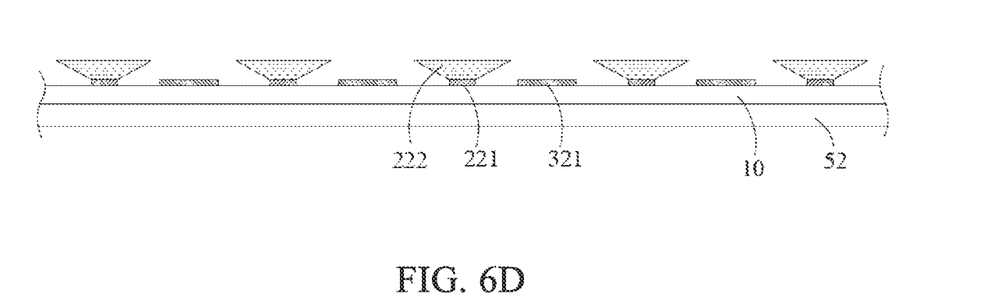
Figure 6E:
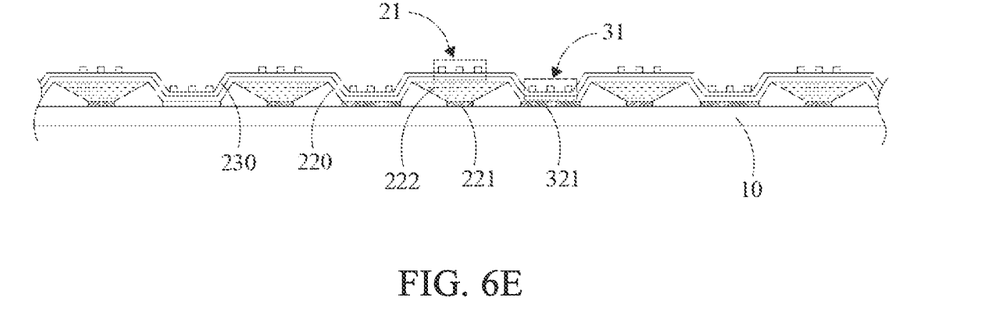

Please refer to FIGS. 5 to 6E. FIG. 5 is a process flow diagram illustrating a manufacturing method of a flexible display panel according to one embodiment of the present application. FIGS. 6A to 6E are schematic views illustrating steps in the manufacturing method of the flexible display panel according to one embodiment of the present application. The manufacturing method of the flexible display panel according to one embodiment of the present application comprises:

Step S10: forming an array layer 230 on a flexible substrate 220.

According to one embodiment of the present application, as shown in FIG. 6A, step S10 comprises: coating a first glass substrate 51 with a flexible material, and forming the flexible substrate 220 through a drying process. The flexible material can comprise, but is not limited to, polyimide. The flexible substrate 220 can comprise the first flexible substrate, the second flexible substrate, and the third flexible substrate in the above-mentioned embodiments. After the flexible substrate 220 is formed, the array layer 230 is formed on the flexible substrate 220. The array layer 230 comprises the first array layer, the second array layer, and the wiring layer in the above-mentioned embodiments.

Step S20: forming a plurality of main pixel units 21 and a plurality of auxiliary pixel units 31 on the array layer 230.

According to one embodiment of the present application, as shown in FIG. 6B, light-emitting devices in the main pixel units 21 and the auxiliary pixel units 31 can be organic light-emitting diodes. After the array layer is formed, the organic light-emitting diodes can be directly formed on the array layer by vapor deposition. The array layer can comprise the first flexible array layer, the second flexible array layer, and the wiring layer in the above embodiments.

In practice, the light-emitting devices in the main pixel units 21 and the auxiliary pixel units 31 can also be micro light-emitting diodes. After the array layer is formed, the micro light-emitting diodes are bonded to the array layer through a mass transfer and bonding process.

According to one embodiment of the present application, after the main pixel units 21 and the auxiliary pixel units 31 are formed, the flexible substrate 220 can be removed from the first glass substrate 51 through a laser lift off (LLO) process.

Step S30: setting an elastic substrate 10 in a pre-stretched state, and forming a plurality of first rigid substrates 221 and a plurality of second rigid substrates 321 on the elastic substrate 10.

According to one embodiment of the present application, as shown in FIG. 6C, the elastic substrate 10 in the pre-stretched state needs to be attached to a second glass substrate 52, and then the first rigid substrate 221 and the second rigid substrate 321 are formed on the elastic substrate 10.

Step S40: forming a support pillar 222 on each of the first rigid substrates 221.

In the present application, as shown in FIG. 6D, step S40 comprises: coating a light-shielding material on the elastic substrate 10, the first rigid substrate 221, and the second rigid substrate 321, and performing a photolithography process on the light-shielding material to form a plurality of the support pillars 222.

Step S50: attaching the flexible substrate to the elastic substrate 10, wherein the main pixel units 21 are aligned with the support pillars 222, and the auxiliary pixel units 31 are aligned with the second rigid substrates 321.

According to one embodiment of the present application, as shown in FIG. 6E, before attaching the elastic substrate 10, it is necessary to coat an adhesive material on the elastic substrate 10 and on one end of each support pillar 222 and one end of each second rigid substrate 321 away from the elastic substrate 10. Then, the flexible substrate is attached to the elastic substrate 10, the support pillars 222, and the second rigid substrates 321. The main pixel unit 21 is located on one side of the first rigid substrate 221 away from the flexible substrate 10, and the auxiliary pixel unit 31 is located on one side of the second rigid substrate 321 away from the elastic substrate 10.

Step S60: restoring the elastic substrate 10 to a natural state.

According to one embodiment of the present application, after the flexible substrate is attached to the elastic substrate 10, the elastic substrate 10 can be peeled off from the second glass substrate, and a tensile stress of the elastic substrate 10 is released to restore the elastic substrate 10 to the natural state shown in FIG. 2.

After step S60 is completed, the above-mentioned flexible display panel can be produced through steps such as cutting steps and bonding steps for driver integrated circuit chips.

Advantages of the present application: The present application provides a flexible display panel, a manufacturing method of the flexible display panel, and an electronic device. The electronic device comprises the flexible display panel. The flexible display panel comprises an elastic substrate, and a plurality of main pixel islands and a plurality of auxiliary pixel islands disposed on the substrate. The auxiliary pixel islands are disposed between the main pixel islands, each main pixel island comprises a plurality of main pixel units, and each auxiliary pixel island comprises a plurality of auxiliary pixel units. When the flexible substrate is in a natural state, the main pixel islands adjacent to the auxiliary pixel islands are close to the auxiliary pixel islands, and the main pixel islands enclose a light emitting side of the auxiliary pixel islands to accommodate the auxiliary pixel islands. Accordingly, the auxiliary pixel islands are arranged without enlarging a spacing between adjacent main pixel islands, so that the present application maintains a pixel density of the flexible display panel in a natural state. When the elastic substrate is in a stretched state, the main pixel islands adjacent to the auxiliary pixel islands are away from the auxiliary pixel islands to expose the auxiliary pixel islands. The exposed auxiliary pixel islands cooperate with the main pixel islands for displaying images, thereby increasing a pixel density of a stretched portion of the flexible display panel, and improving display performance of the stretched portion of the flexible display panel.

In summary, although preferable embodiments of the present application are disclosed as above, the preferable embodiments described above are not intended to limit the present application. Those of ordinary skill in the art can make various changes and modifications without departing from the spirit and scope of the present application. Therefore, the protection scope of the present application is defined by the appended claims.

What is claimed is:

1. A flexible display panel, comprising:
an elastic substrate;
a plurality of main pixel islands arranged on the elastic substrate, the main pixel islands comprising a plurality of main pixel units; and
a plurality of auxiliary pixel islands arranged on the elastic substrate and disposed between the main pixel islands, the auxiliary pixel islands comprising a plurality of auxiliary pixel units;
wherein when the elastic substrate is in a natural state, the main pixel islands adjacent to the auxiliary pixel islands are close to the auxiliary pixel islands, and the main pixel islands enclose a light emitting side of the auxiliary pixel islands to accommodate the auxiliary pixel islands; and when the elastic substrate is in a stretched state, the main pixel islands adjacent to the auxiliary pixel islands are away from the auxiliary pixel islands to expose the auxiliary pixel islands;
wherein each of the main pixel islands comprises a first main body, at least one of the main pixel units is disposed on one side of each first main body away from the elastic substrate, each of the auxiliary pixel islands comprises a second main body, and at least one of the auxiliary pixel units is disposed on one side of each second main body away from the elastic substrate;
wherein a distance between one end of each first main body away from the elastic substrate and the elastic substrate is greater than a distance between one end of each second main body away from the elastic substrate and the elastic substrate; and when the elastic substrate is in the natural state, an orthographic projection of one end of each first main body away from the elastic substrate projected on the elastic substrate is partially overlapped with an orthographic projection of the adjacent second main body projected on the elastic substrate;
wherein each of the first main bodies comprises a first rigid substrate and a support pillar, the support pillar is disposed on one side of the first rigid substrate away from the elastic substrate, and each of the second main bodies comprises a second rigid substrate; and a distance between one end of each support pillar away from the elastic substrate and the elastic substrate is greater than a distance between one end of each second rigid substrate away from the elastic substrate and the elastic substrate.

2. The flexible display panel according to claim 1, wherein a size of one end of the first main body away from the elastic substrate is larger than a size of one end of the first main body close to the elastic substrate.

3. The flexible display panel according to claim 1, wherein the first rigid substrates and the second rigid substrates are arranged in a same layer, and an area of an orthographic projection of each first rigid substrate projected on the elastic substrate is smaller than an area of an orthographic projection of each second rigid substrate projected on the elastic substrate.

4. The flexible display panel according to claim 1, wherein a size of each support pillar gradually decreases in a direction from one end of the support pillar away from the elastic substrate to the elastic substrate.

5. The flexible display panel according to claim 1, wherein a planar shape of one end of each support pillar away from the elastic substrate comprises a rectangle or a rhombus.

6. The flexible display panel according to claim 1, wherein each first main body further comprises a first flexible array layer, each first flexible array layer is disposed on one side of the corresponding support pillar away from the elastic substrate, each second main body further comprises a second flexible array layer, and each second flexible array layer is disposed on one side of the corresponding second rigid substrate away from the elastic substrate; and
wherein the flexible display panel further comprises a plurality of connecting portions, and the connecting portions connect the first flexible array layers and the second flexible array layers adjacent to each other; and when the elastic substrate is in the natural state, the connecting portions are accommodated in a plurality of accommodating spaces enclosed by the first main bodies.

7. An electronic device, comprising a flexible display panel, wherein the flexible display panel comprises:
an elastic substrate;
a plurality of main pixel islands arranged on the elastic substrate, the main pixel islands comprising a plurality of main pixel units; and
a plurality of auxiliary pixel islands arranged on the elastic substrate and disposed between the main pixel islands, the auxiliary pixel islands comprising a plurality of auxiliary pixel units;
wherein when the elastic substrate is in a natural state, the main pixel islands adjacent to the auxiliary pixel islands are close to the auxiliary pixel islands, and the main pixel islands enclose a light emitting side of the auxiliary pixel islands to accommodate the auxiliary pixel islands; and when the elastic substrate is in a stretched state, the main pixel islands adjacent to the auxiliary pixel islands are away from the auxiliary pixel islands to expose the auxiliary pixel islands;
wherein each of the main pixel islands comprises a first main body, at least one of the main pixel units is disposed on one side of each first main body away from the elastic substrate, each of the auxiliary pixel islands comprises a second main body, and at least one of the auxiliary pixel units is disposed on one side of the second main body away from the elastic substrate; and
wherein a distance between one end of each first main body away from the elastic substrate and the elastic substrate is greater than a distance between one end of each second main body away from the elastic substrate and the elastic substrate; and when the elastic substrate is in the natural state, an orthographic projection of one end of each first main body away from the elastic substrate projected on the elastic substrate is partially overlapped with an orthographic projection of the adjacent second main body projected on the elastic substrate;
wherein each of the first main bodies comprises a first rigid substrate and a support pillar, the support pillar is disposed on one side of the first rigid substrate away from the elastic substrate, and each of the second main bodies comprises a second rigid substrate; and a distance between one end of each support pillar away from the elastic substrate and the elastic substrate is greater than a distance between one end of the second rigid substrate away from the elastic substrate and the elastic substrate.

8. The electronic device according to claim 7, wherein a size of one end of the first main body away from the elastic substrate is larger than a size of one end of the first main body close to the elastic substrate.

9. The electronic device according to claim 7, wherein the first rigid substrates and the second rigid substrates are arranged in a same layer, and an area of an orthographic projection of each first rigid substrate projected on the elastic substrate is smaller than an area of an orthographic projection of each second rigid substrate projected on the elastic substrate.

10. The electronic device according to claim 7, wherein a size of each support pillar gradually decreases in a direction from one end of the support pillar away from the elastic substrate to the elastic substrate.

11. The electronic device according to claim 7, wherein a planar shape of one end of each support pillar away from the elastic substrate comprises a rectangle or a rhombus.

12. The electronic device according to claim 7, wherein each first main body further comprises a first flexible array layer, each first flexible array layer is disposed on one side of the corresponding support pillar away from the elastic substrate, each second main body further comprises a second flexible array layer, and each second flexible array layer is disposed on one side of the corresponding second rigid substrate away from the elastic substrate; and wherein the flexible display panel further comprises a plurality of connecting portions, and the connecting portions connect the first flexible array layers and the second flexible array layers adjacent to each other; and when the elastic substrate is in the natural state, the connecting portions are accommodated in a plurality of accommodating spaces enclosed by the first main bodies.

13. A manufacturing method of a flexible display panel, comprising:
   forming an array layer on a flexible substrate;
   forming a plurality of main pixel units and a plurality of auxiliary pixel units on the array layer;
   setting an elastic substrate in a pre-stretched state, and forming a plurality of first rigid substrates and a plurality of second rigid substrates on the elastic substrate;
   forming a support pillar on each of first rigid substrates;
   attaching the flexible substrate to the elastic substrate, wherein the main pixel units are aligned with the support pillars, and the auxiliary pixel units are aligned with the second rigid substrates; and
   restoring the elastic substrate to a natural state.

* * * * *